United States Patent [19]

Mogi

[11] 4,041,402

[45] Aug. 9, 1977

[54] CHANNEL SELECTION AND INDICATING SYSTEM

[75] Inventor: Takao Mogi, Tokyo, Japan

[73] Assignee: Sony Corporation, Tokyo, Japan

[21] Appl. No.: 592,339

[22] Filed: July 1, 1975

[30] Foreign Application Priority Data

July 5, 1974   Japan ................................. 49-76962

[51] Int. Cl.² .............................................. H04B 1/06
[52] U.S. Cl. .................................. 325/465; 325/455; 325/464; 358/192
[58] Field of Search .................... 325/455, 464, 465; 340/168 R; 334/86; 324/80, 81; 178/DIG. 15; 358/192

[56] References Cited

U.S. PATENT DOCUMENTS

| | | | |
|---|---|---|---|
| 3,671,869 | 6/1972 | Wolfram | 325/455 |
| 3,748,645 | 7/1973 | Kawashima | 325/465 |
| 3,822,405 | 7/1974 | Sakamoto | 325/464 |
| 3,845,394 | 10/1974 | Hamada | 325/455 |
| 3,882,400 | 6/1975 | Hamada | 325/455 |
| 3,940,702 | 2/1976 | Yoshimura et al. | 325/464 |
| 3,955,145 | 5/1976 | Kawashima | 325/465 |
| 3,968,440 | 7/1976 | Ehni | 325/455 |
| 3,979,680 | 9/1976 | Sakamoto | 325/464 |

*Primary Examiner*—John W. Caldwell
*Assistant Examiner*—James J. Groody
*Attorney, Agent, or Firm*—Hill, Gross, Simpson, Van Santen, Steadman, Chiara & Simpson

[57] ABSTRACT

A channel programming and indicating system for a television receiver, in which a programming of channel numbers is achieved by the plurality of receiving channel selecting switches. A random access memory is used to program channel numbers by the channel selecting switches in accordance with a selected position.

10 Claims, 1 Drawing Figure

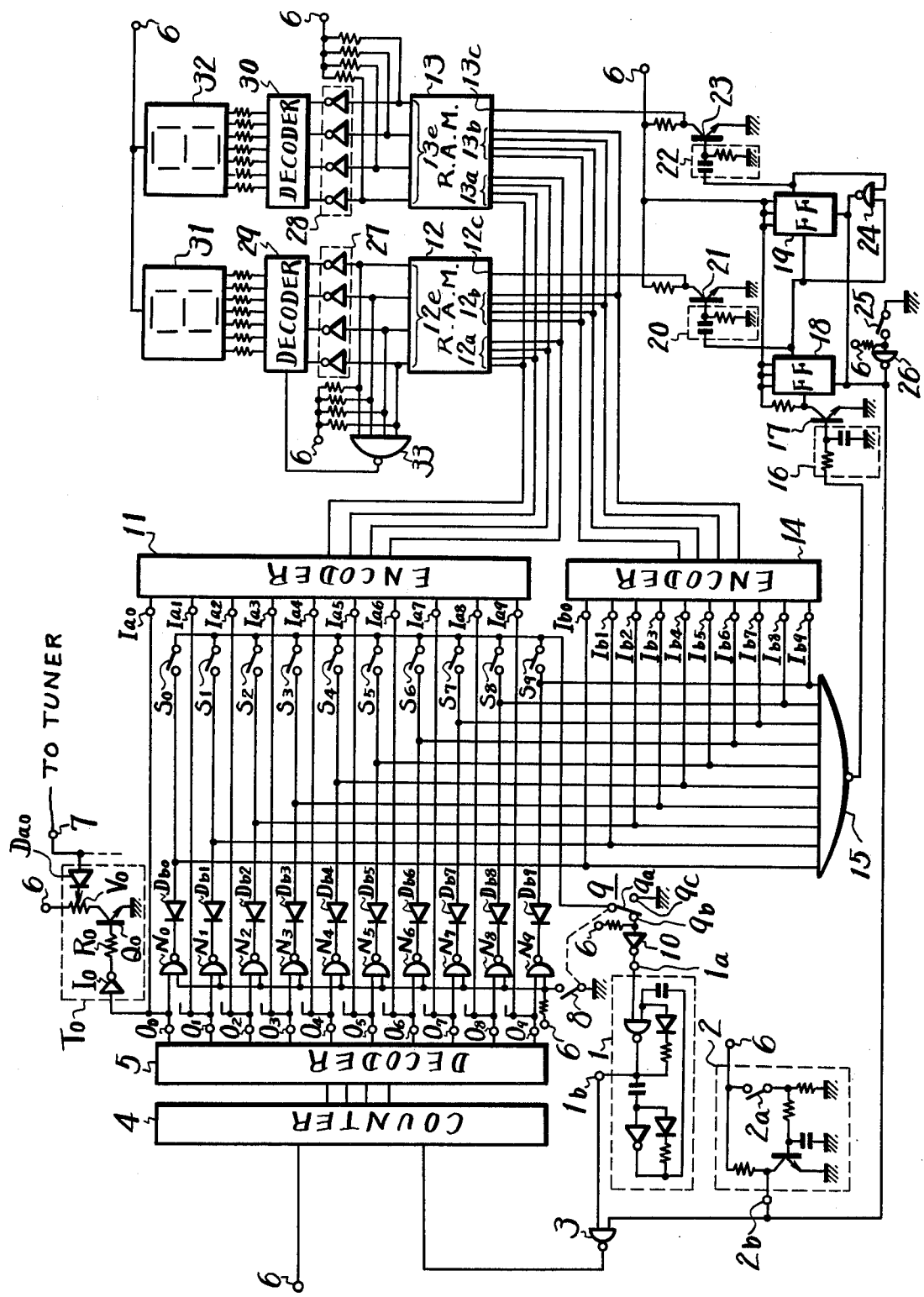

CHANNEL SELECTION AND INDICATING SYSTEM

BACKGROUND OF THE INVENTION

1. Field of the Invention

This invention relates generally to a channel indicating system for a television receiver, and more particularly to a channel programming and indicating system for a television receiver using an electronic tuning tuner.

2. Description of the Prior Art

It is known to provide exchangeable channel indicating plates beside each of a number of channel selecting buttons for indicating a receiving channel in a television receiver using an electronic tuner. However, it is troublesome to attach or change such channel indicating plates in response to the requirements of locally available channels. Further, channel indicating plates which are temporarily unnecessary can be easily lost.

SUMMARY OF THE INVENTION

Disadvantages and shortcomings of the aforesaid prior art are overcome by this invention. A random access memory is connected to a channel indicating device. An address encoder and a data encoder are connected to a channel selecting means and a plurality of channel selecting switches, respectively. Output signals from the address and the data encoders are supplied to the random access memory, respectively. The channel selecting switches are used both as channel selecting switches and channel number programming switches.

It is an object of this invention to provide an improved channel programming and indicating system for a television receiver. Another object of this invention is to provide a channel programming system which may be easily programmed.

Still another object of this invention is to provide a channel number programming system controlled completely electrically.

Another object of this invention is to provide a channel number programming and indicating system in which the programming of channel numbers is achieved by using receiving channel selecting switches.

BRIEF DESCRIPTION OF THE DRAWING

The single drawing shows a circuit diagram of a preferred embodiment of this invention.

DESCRIPTION OF THE PREFERRED EMBODIMENT

In the drawing, reference numeral 1 designates a clock pulse generator. The clock pulse generator 1 produces at its output terminal 1b clock pulses with a predetermined repetition rate (for example, 1 millisecond) when its input terminal 1a becomes "1" in level. Reference numeral 2 designates a single-shot pulse generator which produces at its output terminal 2b a single-shot pulse each time a switch 2a is closed or made ON.

Normally, at the ouput terminals 1b and 2b of the pulse generators 1 and 2 there is obtained an output of the level "1", and a pulse signal which may drive a counter described later is obtained when the level changes from "1" to "0".

The output terminals 1b and 2b of the pulse generators 1 and 2 are connected to first and second input terminals of a NAND-circuit 3, respectively. The output terminal of the NAND-circuit 3 becomes "0" in level when the input signals thereto are "1" and "1", but becomes "1" in level when the input signals are in the other conditions. The output terminal of the NAND-circuit 3 is connected to the input terminal of a decade counter 4. The decade counter 4 counts pulse signals applied to its input terminal and delivers the counted signals to its output terminals as binary numbers. The output terminals of the counter 4 are connected to the input terminals of a decoder 5 which may convert a binary number to a decimal number.

The decoder 5 has four input terminals for representing 1248 code and ten output terminals $O_0, O_1, \ldots O_9$ for representing numbers of 0 to 9. When the input signal to the decoder 5 is (0000), the output terminal $O_0$ becomes "0" in level; when the input signal is (0001), the output terminal $O_1$ becomes "0" in level; ..... when the input signal is (1001), the output terminal $O_9$ becomes "0" in level, respectively.

The output terminal $O_0$ is connected through a series circuit of an inverter $I_0$ and a resistor $R_0$ to the base of an NPN-type transistor $Q_0$ having a grounded emitter and a collector connected through a variable resistor $V_o$ to a voltage source terminal 6 which is supplied with a voltage $+V_{cc}$. The sliding contact of the variable resistor $V_o$ is connected to the cathode of a diode $D_{ao}$.

Though not shown, similarly constructed circuits are connected to the output terminals $O_1, O_2, \ldots O_9$, and the anodes of their diodes $D_{a0}, D_{a1}$ (not shown) .... $D_{a9}$ (not shown) are connected together to an output terminal 7. In this case, the inverter $I_0$, the resistor $R_o$, the transistor $Q_0$, the variable resistor $V_0$ and the diode $D_{a0}$ form a tuning voltage generating circuit $T_0$ and, though not shown, the other inverters $I_1, \ldots I_9$, resistors $R_1, \ldots R_9$, transistors $Q_1, \ldots Q_9$, variable resistors $V_1, \ldots V_9$ and diodes $D_{a1}, \ldots D_{a9}, \ldots$ similarly form tuning voltage generating circuits $T_1, \ldots T_9$, respectively, to supply voltages set by the variable resistors $V_0, V_1, \ldots V_9$ through the output terminal 7 to an electronic tuner (not shown).

The electronic tuner, involved herein varies its receiving frequency in response to a voltage level applied thereto.

The output terminals $O_0, O_1, \ldots O_9$ of the decoder 5 are further connected to first input terminals of NAND-circuits $N_0, N_1, \ldots N_9$, respectively, which have second input terminals connected together and then grounded through a switch 8. The output terminals of the NAND-circuits $N_0, N_1, \ldots N_9$ are connected to the cathode of diodes $D_{b0}, d_{b1}, \ldots D_{b9}$, respectively, whose anodes are connected together through switches $S_0, S_1, \ldots S_9$, respectively, and then to a movable contact piece 9a of a switch 9.

The diodes $D_{b0}, d_{b1}, \ldots D_{b9}$ are capable of being conductive when the respective NAND-circuits $N_0, N_1, \ldots N_9$ produce outputs of "0", but become non-conductive when the NAND-circuits $N_0, N_1, \ldots N_9$ produce outputs of "1". The switches $S_0, S_1, \ldots S_9$ are respectively numbered, for example, the switch $S_0$ is numbered as decimal 0, switch $S_1$ as decimal 1, ..... switch $S_9$ as decimal 9 and they are automatic reset ones, respectively.

A first stationary or fixed contact piece 9b of the switch 9 is connected through an inverter 10 to the input terminal 1a of the pulse generator 1, while a second stationary or fixed contact piece 9c of the switch 9 is grounded. The switches 8 and 9 are ganged with each other such that when the switch 8 is in the OFF-state, the movable contact 9c of the switch 9 is connected to its first fixed contact 9b as shown, while when the switch 8 is in ON-state, the movable contact 9a is connected to the second fixed contact 9c.

The output terminals $O_0$, $O_1$, .... $O_9$ of the decoder 5 are connected further to input terminals $I_{a0}$, $I_{a1}$, .. $I_{a9}$ of an encoder 11, respectively, which may convert a decimal number to a binary number. In this case, the encoder 11 has ten input terminals $I_{a0}$, $I_{a1}$, .. $I_{a9}$ corresponding to numbers 0, 1, .... (as mentioned above) and four output terminals for producing outputs of 1248 code. When the input terminal $I_{a0}$ is "0" in level, the encoder 11 produces an output of (0000); when the input terminal $I_{a1}$ is "0", the encoder 11 produces an output of (0001); .... when the input terminal $I_{a9}$ is "0", the encoder 11 produces an output of (1001), respectively.

The four output terminals of the encoder 11 are connected to four address input terminals 12a and 13a of random access memories (RAM) 12 and 13, respectively.

The connection points between the diodes $D_{b0}$, $D_{b1}$, .... $D_{b9}$ and the switches $S_0$, $S_1$, ..... $S_9$ are connected to input terminals $I_{b0}$, $I_{b1}$, ... $I_{b9}$ of an encoder 14 similarly to the encoder 11. Four output terminals of the encoder 14 are connected to four data input terminals 12b and 13b of the random access memories 12 and 13, respectively. The random access memories 12 and 13 have four address input terminals 12a and 13a, four data input terminals 12b and 13b (mentioned above) and write control terminals 12c and 13c, respectively. The address input terminals 12a and 13a are supplied with address signals assigned numbers 0 – 9 converted to binary numbers, the data input terminals 12b and 13b are supplied with arbitrary data signals of 0 – 9 similarly converted to binary numbers, and under such conditions the write control terminals 12c and 13c are supplied with write pulses. Thus, the random access memories 12 and 13 memorize the arbitrary data at the assigned addresses.

After the memory is finished, if the assigned address signals are supplied to the address input terminals 12a and 13a, the arbitrary data signals can be obtained at output terminals 12e and 13e of the random access memories 12 and 13, respectively. In this case, the output signals of the random access memories 12 and 13 are assumed as inverted ones of "0" and "1" of the data signals.

The connection points between the diodes $D_{b0}$, $D_{b1}$, .... $D_{b9}$ and the switches $S_0$, $S_1$, ..... $S_9$ are also connected to the input terminals of a NAND-circuit 15 whose output terminal is connected through a chattering prevention circuit 16 consisting of a resistor and a capacitor and through an NPN-type transistor 17 to the trigger terminal of a flip-flop circuit 18. The Q-output terminal of the flip-flop circuit 18 is connected to the trigger terminal of a flip-flop circuit 19, and further to the write control terminal 12c of the random access memory 12 through a differentiating circuit 20 consisting of a capacitor and a resistor and through an NPN-type transistor 21. The Q-output terminal of the flip-flop circuit 19 is connected to the write control terminal 13c of the random access memory 13 through a differentiating circuit 22 consisting of a capacitor and a resistor and through an NPN-type transistor 23. The Q-output terminals of the respective flip-flop circuits 18 and 19 are connected to first and second input terminals of a NAND-circuit 24 whose output terminal is connected to reset terminals of the flip-flop circuits 18 and 19, respectively. The output terminal 2b of the single-shot pulse generator 2 is connected to the reset terminals of the flip-flop circuits 18 and 19, respectively.

One end of a switch 25, whose other end is grounded, is connected through an NAND gate 26 to the reset terminals of the flip-flop circuits 18 and 19, respectively.

Four output terminals 12e and 13e of the random access memories 12 and 13 are connected through inverters 27 and 28 to the input terminals of decoders 29 and 30 which convert binary numbers to signals required for 7 segment indicating devices. Seven output terminals of the respective decoders 29 and 30 are connected to the input terminals of the indicating devices 31 and 32, respectively. Each of the indicating devices 31 and 32 comprises individual segmented light emitting diodes arranged in a Figure "8" configuration such that any one of the numerals of the decimal digits group "1", "2", .... "9", "0" may be displayed by energization of selected light emitting diodes.

The indicating devices 31 and 32 are arranged in the horizontal direction such that the indicating device 31 indicates any digit of tens and the other indicating device 32 indicates any digit of units, respectively. The four output terminals 12e of the random access memory 12 are connected to the input terminals of a NAND-circuit 33, and the output terminal of the latter is connected to the blanking input terminal of the decoder 29.

With the channel indicating system of the present invention, the setting of broadcasting frequency to be selected and the programming of channel number to be displayed are carried out as follows. The following description will be given on the case, by way of example, where the switch $S_0$ is used for receiving the channel 12 broadcasting frequency, and numbers "1" and "2" are simultaneously displayed on the indicating devices 31 and 32 to display decimal 12.

Firstly, the channel selecting mode or procedure for receiving the broadcasting frequency of channel 12 with respect to the switch $S_0$ will be described.

The mode change-over switch 8 is made OFF to connect the movable contact 9a of the mode change-over switch 9 to the first fixed contact 9b thereof. Then, the switch $S_0$ is closed. In this case, if the output at the output terminal $O_0$ of the decoder 5 is not the level "0", the output of the NAND-circuit No is the level "0". Therefore, the input terminal of the inverter 10 becomes the level "0". As a result, the output terminal of the inverter 10 becomes the level "1", and the input terminal 1a of the pulse generator 1 becomes the level "1". Thus, the pulse generator 1 operates.

At every time when the level at the output terminal 1b of the pulse generator 1 switches down, the output signal of the NAND-circuit 3 switches up. The counter 4 is driven at the switching up of the NAND-circuit 3.

In this case, the counter 4 starts its counting from the state that arbitrary numbers are counted and produces at its output terminal an output of (0000) when the counted content thereof becomes decimal 0.

By supplying the output signal from the counter 4 to the decoder 5, its output terminal $O_0$ which corresponds to decimal 0 becomes the level "0". Thus, the first input terminal of the NAND-circuit No becomes the level "0", and its output terminal becomes the level "1" to make the diode $D_{b0}$ non-conductive. As a result, the input terminal of the inverter 10 becomes the level "1", its output terminal becomes "0" in level; the input terminal 1a of the pulse generator becomes the level "0" and the operation of the pulse generator 1 is stopped. At the time when the pulse generator 1 stops its operation, only the output terminal $O_0$ of the decoder 5 becomes the level "0" but all of its other output terminals $O_1$, $O_2$, .... $O_9$ are held at the level "1". Therefore, the input terminal of the inverter $I_0$ in the tuning voltage generating circuit $T_0$ becomes the level "0" and its output terminal becomes the level "1" to make the transistor $Q_0$ conductive. Then, the sliding piece of the variable resistor $V_0$ is so adjusted that the voltage, which will make it possible to tune the broadcasting frequency of channel 12 in the electronic tuner, is obtained. Thus, with respect to the switch $S_0$, the setting for receiving the broadcasting wave of channel 12 is achieved. That is, by the above operation, the predetermined tuning voltage is obtained from the tuning voltage generating circuit $T_0$ in correspondence with the switch $S_0$ to make it possible to receive the desired broadcasting frequency.

Next, the channel number programming mode or procedure for programming the channel number in correspondence with the received broadcasting frequency will be described.

Firstly, the switch 8 is made ON to connect the movable contact 9a of the switch 9 to its second fixed contact 9c. When, the switch 8 is made ON, the second input terminals of the NAND-circuits $N_0$, $N_1$, .... $N_9$ become the level "0". Thus, the output terminals of all the NAND-circuits $N_0$, $N_1$, .... $N_9$ become the level "1" and all the diodes $D_{b0}$, $D_{b1}$, .... $D_{b9}$ become nonconductive. As a result, all the input terminals of the encoder 14 and the NAND- circuit 15 are made "1" in level, and then the output terminal of the NAND-circuit 15 becomes the level "0". By supplying the output signal of decimal 0 from the decoder 5 to the encoder 11, at the output terminal of the encoder 11 there is obtained an output signal of (0000) which is then applied to the address input terminals 12a and 13a of the random access memories 12 and 13.

Under such a state, one of switches $S_0$, $S_1$, .... $S_9$ or switch $S_1$ which corresponds to the numeral "1" of tens in the channel number "12" of the broadcasting frequency of channel 12 is made ON. Thus, the input terminal $I_{b1}$ of the encoder 14 is grounded through the switches $S_1$ and 9 and hence "0" in level while the other input terminals $I_{b0}$, $I_{b2}$, .... $I_{b9}$ become the level "1". In other words, the input signal to the encoder 14 becomes decimal 1 and it produces an output signal of (0001) at its output terminal. The output signal (0001) is then applied to the data input terminals 12b and 13b of the random access memories 12 and 13.

Further, at the time when the switch $S_1$ is made ON, one of the input terminals of the NAND-circuit 15 is grounded through the switches $S_1$ and 9 and becomes the level "0", so that the output terminal of the NAND-circuit 15 becomes the level "1". Accordingly, the transistor 17 becomes conductive after a predetermined time due to the chattering prevention circuit 16. As a result, the flip-flop circuit 18 is supplied with a trigger pulse of negative polarity and then triggered. Thus, the Q-output terminal of the flip-flop circuit 18 is changed from the level "0" to the level "1". Since this change of the level at the Q-output terminal of the flip-flop circuit 18 is supplied through the differentiating circuit 20 to the base of the transistor 21, the transistor 21 becomes conductive temporarily. Therefore, the write pulse is applied to the write control terminal 12c of the random access memory 12.

As a result, the random access memory 12 is supplied at its address input terminal 12a with the signal (0000), at its data input terminal 12b with the signal (0001) and at its write control terminal 12c with the write pulse, respectively, so that the data (0001) is programmed at the address (0000) of the random access memory 12, and accordingly decimal 1 is displayed on the indicating device 31.

In this case, since the switch $S_1$ is an automatic reset type, if the user's hand is removed from the switch $S_1$ after ascertaining that decimal 1 is displayed on the indicating device 31 and programmed, the switch $S_1$ becomes OFF automatically.

Under such a state, the switch $S_2$ of the switches $S_0$, $S_1$, .... $S_9$, which corresponds to the numeral decimal 2 of units of the channel number "12" of the selected channel 12 broadcasting frequency, is made ON. Accordingly, the input terminal $I_{b2}$ of the encoder 14 is grounded through the switches $S_2$ and 9 and becomes the level "0", while the other input terminals $I_{b0}$, $I_{b1}$, $I_{b3}$, $I_{b4}$, .... $I_{b9}$ of the encoder 14 become the level "1". That is, the input signal to the encoder 14 becomes decimal 2 and it produces at its output terminal an output of (0010). The output signal (0010) is fed to the data input terminals 12b and 13b of the random access memories 12 and 13.

Further, at the time when the switch $S_2$ is made ON, one of the input terminals of the NAND-circuit 15 is grounded through the switches $S_2$ and 9 and becomes the level "0", so that the output terminal of the NAND-circuit 15 becomes the level "1" again. Thus, the transistor 17 becomes conductive after the predetermined time due to the chattering prevention circuit 16. Therefore, the flip-flop circuit 18 is supplied with the trigger pulse of negative polarity and triggered again. Thus, the Q-output terminal of the flip-flop circuit 18 is changed from the level "1" to the level "0".

By the decrease of the Q-output terminal of the flip-flop circuit 18, the flip-flop circuit 19 is triggered and its Q-output terminal is changed from the level "0" to the level "1". This level change at the Q-output terminal of the flip-flop circuit 19 is fed through the differentiating circuit 22 to the base of the transistor 23. Thus, the transistor 23 becomes conductive temporarily and the write pulse is supplied to the write control terminal 13c of the random access memory 13. As a result, the random access memory 13 is supplied at its address input terminal 13a with the signal (0000), at its data input terminal 13b with the signal (0010) and its write control terminal 13c with the write pulse, respectively, so that the date (0010) is programmed at the address (0000) of the random access memory 13. Further, decimal 2 is displayed on the indicating device 32.

The procedure for sequentially proceeding with the channel selection and the program of channel number will be described.

When the switch 2a of the pulse generator 2 is made ON, the level at the output terminal 2b of the pulse generator 2 falls down and the level at the output terminal of the NAND-circuit 3 rises up. Accordingly, decimal 1 is added in the counter 4 and the counter 4 produces an output signal (0001). Thus, the output terminal $O_1$ of the decoder 5, which corresponds to decimal 1, becomes the level "0". As a result, the input terminal of the inverter $I_1$ in the tuning voltage generating circuit $T_1$ becomes the level "0" and its output terminal becomes the level "1" to make the transistor $Q_1$ conductive. Where, the sliding contact of the variable resistor $V_1$ is adjusted to receive a predetermined broadcasting frequency similar to the above case. The output pulse from the pulse generator 2 is also supplied to the reset terminals of the flip-flop circuits 18 and 19 to reset the same.

Similarly, by making ON one of the switches $S_0$, $S_1$, . . . . $S_9$ which corresponds to the channel number of the received broadcasting frequency, a predetermined channel number is programmed at the address (0001) of the random access memories 12 and 13 and the channel number is displayed on the indicating devices 31 and 32.

By repeating the above described operation, broadcasting frequencies are received in connection with the switches $S_0$, $S_1$, . . . . $S_9$, their channel numbers are programmed at addresses (0000), (0001), . . . . (1001) of the random access memories 12 and 13, respectively, and the channel numbers are displayed on the indicating devices 31 and 32, respectively.

In the case where the programming is achieved in the random access memories 12 and 13, if the switches, for example, $S_0 S_1$, . . . . $S_9$ are erroneously pushed (or made ON), the switch 25 is made ON. Thus, the input terminal of the inverter 26 becomes the level "0" and its output terminal becomes the level "1". Then, at the time when the switch 25 is made OFF, the output signal from the inverter 26 falls down and hence the flip-flop circuits 18 and 19 are reset. As a result, a new programming is possible.

Further, it is possible that after the setting of broadcasting wave and the programming of channel numbers are carried out in connection with, for example, the switch $S_0$, the setting of broadcasting frequency and the programming of channel numbers are carried out in connection with the switch $S_8$. In such a case, the switch 8 is once made OFF and hence the movable contact 9a of the switch 9 is connected to its first fixed contact 9b. Thereafter, the switch $S_8$ is made ON and an operation similar to that of the switch $S_0$ is carried out. In this case, by making OFF the switch 8, one of the diodes $D_{b0}$, $D_{b1}$, . . . . $D_{b9}$ becomes conductive and one of the input terminals of the NAND-circuit 15 become the level "0" to make its output terminal at the level "1". As a result, the transistor 17 becomes conductive and the flip-flop circuit 18 is triggered. After the setting of the broadcasting frequency and the programming of channel numbers in connection with the switch $S_0$ are carried out, the Q-output terminal of the flip-flop circuit 18 is "0" in level and the Q-output terminal of the flip-flop circuit 19 is "1" in level. Under such a condition, when the flip-flop circuit 18 is triggered, the Q-output terminals of both the flip-flop circuits 18 and 19 become the level "1". Accordingly, both the input terminals of the NAND-circuit 24 become the level "1" and its output terminal falls down from the level "1" to the level "0 to reset the flip-flop circuits 18 and 19 together. Accordingly, even in this case, the random access memories 12 and 13 can be supplied with the write pulses in the correct order.

A description will be now given on the case where an ordinary channel selection is carried out by the system of this invention.

In this case, the switch 8 is made OFF and the movable contact 9a of the switch 9 is connected to its fixed contact 9b. Under this condition, one of the switches $S_0$, $S_1$, . . . . $S_9$ which corresponds to a desired channel to be selected, for example, the switch $S_0$ is made ON. Accordingly, when the output terminal $O_0$ of the decoder 5 is not at the level "0", the pulse generator 1 drives the counter 4. At the time when the output terminal $O_0$ of the decoder 5 becomes the level "0", the pulse generator 1 stops its operation and the broadcasting frequency of channel 12 is received due to the tuning voltage generating circuit $T_0$. As the output terminal $O_0$ of the decoder 5 becomes the level "0", the output signal of the encoder 11 becomes (0000). Thus, the data (0001) and (0010) programmed at the addresses (0000) of the random access memories 12 and 13 are obtained at their output terminals 12e and 13e, respectively. Since the outputs from the random access memories 12 and 13 are reversed at "1" and "0", they are again reversed at the inverters 27 and 28 and then supplied through the decoders 29 and 30 to the indicating devices 31 and 32 to be displayed as decimal 1 and decimal 2. Thus, the receiving of channel "12" is displayed.

Similary, if arbitrary one of the switches $S_0$, $S_1$, . . . . $S_9$ is made ON, a predetermined broadcasting frequency is received by one of the tuning voltage generating circuits $T_0$, $T_1$, . . . . $T_9$ corresponding to the switch which is made ON and the channel number of the received broadcasting wave is displayed on the indicating devices 31 and 32.

Further, it is possible that the respective channels are received sequentially. That is, if the switch 2a of the pulse generator 2 is made ON, decimal 1 is added in the counter 4 and the output terminal of the decoder 5 at the level "0" is moved from, for example, the output terminal $O_0$ to that $O_1$. Accordingly, a predetermined broadcasting frequency is received by the tuning voltage generating circuit $T_1$, and the channel number of the predetermined broadcasting frequency programmed at the respective addresses (0001) of the random access memories 12 and 13 is displayed on the indicating devices 31 and 32.

Similarly, at every time when the switch 2a is made ON, a predetermined broadcasting frequency is received sequentially.

When decimal 0 is obtained as an output by the random access memory 12 for displaying the numeral of tens, the output signal from the random access memory 12 becomes (1111) which is then fed to the input terminal of the NAND-circuit 33. Thus, its output terminal becomes the level "0", and hence the output signal of the decoder 29 is blanked or unnecessary zero (0) is suppressed. Therefore, when, for example, the channel 1 is displayed, the display is decimal 1 instead of decimal 01.

The random access memories 12 and 13 are always supplied with operating voltage from a battery (not shown) to avoid that even when the television receiver which provides with the system of this invention is in power off state, the contents of the random access memories are not cleared. It is also possible for the same purpose that a memory non-volatile be employed.

As described above, with the system according to the present invention, the channel selection can be easily carried out by making ON the switches $S_0$, $S_1$, . . . . $S_9$. Further, the channel number of the selected broadcasting frequency can be displayed by the output from the random access memories 12 and 13. In this case, it is easy that the channel number to be displayed is programmed in the random access memories 12 and 13. In addition, since the switches $S_0$, $S_1$, . . . . $S_9$ for channel selection are also used for data input, the construction is simple so much.

Many modifications and variations of this embodiment could be effected by one skilled in the art without departing from the spirit and scope of the novel concepts of the present invention, so that the scope of the invention should be determined by the appended claims only.

I claim as my invention:

1. In a television receiver having an electronic tuner which is responsive to a given input tuning voltage for establishing a tuning condition, a channel selection and indicating system comprising:
   a plurality of channel selection means for producing respective input tuning voltages,
   each of said channel selection means having a switch connected in circuit therewith,
   means responsive to the operation of one of said switches for coupling a tuning voltage from a predetermined one of said channel selection means to said electronic tuner,
   a memory means having address terminals, data terminals and output terminals,
   address signal generating means coupled between said channel selection means and said address terminals of said memory means,
   data signal generating means coupled in circuit between said switches and said data terminals of said memory means,
   channel indicating means coupled in circuit with the output terminals of said memory means,
   mode switching means for causing said switches to have in one mode the function of channel selection and in another mode the function of providing a path for programming the output of said memory thereby to yield a given channel number for a given address of said memory,
   said channel selecting means comprising a pulse generating means, a counter connected to said pulse generating means, a decoder connected to said counter, and tuning voltage generating means connected to said decoder, each one of said switches being in circuit with said pulse generating means and respective outputs of the decoder such that a respective signal output of the decoder is coupled through said respective switches to operate the pulse generating means and such that the pulse generating means ceases to operate when the output of the decoder acquires a predetermined state as a result of the count of said counter.

2. A channel selection and indicating system for a television receiver according to claim 1, wherein said channel indicating means comprises at least a units digit indicating device having a plurality of display elements in segmented configuration capable of indicating 10 units digits of channel numbers by selective engerization of its display elements.

3. A channel selection and indicating system for a television receiver according to Claim 1 further comprising write pulse generating means connected to said memory means, and circuit means for controlling the application of a write signal in response to the programming of a channel number.

4. A channel selection and indicating system for a television receiver according to claim 3 wherein said write pulse generating means has a coupling to each of said plurality of switches.

5. A channel selection and indicating system for a television receiver according to claim 2 further comprising a tens digit indicating device having a plurality of display elements in segmented configuration capable of indicating 10 tens digits of channel numbers by selective energization of its display elements.

6. A channel selection and indicating system for a television receiver according to claim 3 wherein said write pulse generating means comprises two serially connected flip-flops.

7. A channel selection and indicating system for a television receiver according to claim 1, wherein said mode switching means comprises a switch having a movable contact, a first stationary contact, and a second stationary contact and is connected to said plurality of switches, said pulse generating means, and ground, respectively.

8. A channel selection and indicating system for a television receiver according to claim 1 wherein said address signal generating means comprises an address encoder and said data signal generating means comprises a data encoder.

9. A channel selection and indicating device in accordance with claim 1 wherein the memory means have write control terminals and wherein each of said switches are coupled to respective inputs of a decimal-binary encoder and the outputs of said encoder are coupled to the data terminals of said memory means, a gate circuit having a single binary output, each of said switches is also coupled to inputs of said gate circuit, a pair of flip-flop circuits coupled in circuit with said single binary output and each of said flip-flops having an output coupled to respective write control terminals of said memory means, wherein changes in the binary input signals of said gate circuit cause a switching of energization from one write control terminal to another.

10. A channel selection and indicating device comprising:
   a pair of channel number indicating means,
   a separate memory means each with address terminals for each of said channel number indicating means and having their respective data outputs coupled to said channel number indicating means,
   circuit means for selecting a given channel and means having address outputs for each selected channel, each of said address outputs being coupled to selected ones of the address terminals of each of said memory means for each channel being selected,
   said circuit means including a plurality of switches for channel selection, means for using said switches apart from the selection function to produce a binary output which is useable as a data input signal to each of said memory means to program channel numbers for said channel number indicating means.
   and means for sequentially programming each of said memory means whereby one of said memory means may be used to represent the ten's digits and the other may be used to represent the unit's digits of a two digit channel number.

* * * * *